US008780658B2

(12) United States Patent
Jung et al.

(10) Patent No.: US 8,780,658 B2
(45) Date of Patent: Jul. 15, 2014

(54) LEAKAGE REDUCTION IN MEMORY DEVICES

(75) Inventors: Chang Ho Jung, San Diego, CA (US); Nan Chen, San Diego, CA (US); Cheng Zhong, San Diego, CA (US); Zhiqin Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 79 days.

(21) Appl. No.: 12/397,142

(22) Filed: Mar. 3, 2009

(65) Prior Publication Data

US 2010/0226191 A1 Sep. 9, 2010

(51) Int. Cl.
| | |
|---|---|
| *G11C 7/00* | (2006.01) |
| *G11C 5/14* | (2006.01) |
| *G11C 11/4094* | (2006.01) |
| *G11C 7/22* | (2006.01) |
| *H03K 19/00* | (2006.01) |

(52) U.S. Cl.
CPC .............. *G11C 7/00* (2013.01); *G11C 11/4094* (2013.01); *G11C 7/22* (2013.01); *H03K 19/0016* (2013.01)
USPC .......................................... 365/203; 365/226

(58) Field of Classification Search
CPC .............. G11C 7/00; G11C 5/14; G11C 7/22; G11C 8/08; G11C 11/413; G11C 11/4094; H03K 19/0016
See application file for complete search history.

(56) References Cited

U.S. PATENT DOCUMENTS

| | | | | | |
|---|---|---|---|---|---|
| 5,566,120 | A | * | 10/1996 | D'Souza ........................ | 365/227 |
| 5,615,162 | A | * | 3/1997 | Houston ........................ | 365/226 |
| 6,411,560 | B1 | * | 6/2002 | Tanizaki et al. ............... | 365/227 |
| 7,272,068 | B2 | * | 9/2007 | Yamaoka et al. .............. | 365/226 |
| 2005/0128852 | A1 | * | 6/2005 | Deng et al. .................... | 365/226 |

FOREIGN PATENT DOCUMENTS

WO 2008144526 11/2008

OTHER PUBLICATIONS

Kapoor B et al: "Tutorial: SoC Power Management Verification and Testing Issues" Microprocessor Test and Verification, 2008. MTV '08. Ninth International Workshop on, IEEE, Piscataway, NJ, USA, Dec. 8, 2008, pp. 67-72, XP031472570 ISBN: 978-1-4244-3682-8, p. 68, left-hand column, paragraph 2—right-hand column, last paragraph, p. 69, right-hand column, paragraph 3-paragraph 6.
International Search Report—PCT/ US2010/026104, International Search Authority—European Patent Office Jun. 23, 2010.
Written Opinion—PCT/ US2010/026104, International Search Authority—European Patent Office Jun. 23, 2010.

* cited by examiner

*Primary Examiner* — Hoai V Ho
*Assistant Examiner* — James G Norman
(74) *Attorney, Agent, or Firm* — Linda G. Gunderson (57) ABSTRACT

A memory device includes a core array that includes memory cells. The memory device also includes a headswitch coupled to the core array and a positive supply voltage. The headswitch reduces leakage current from the core array by disconnecting the core array from the positive supply voltage. Additionally, head switches are added for pre-charge devices to further reduce leakage current.

20 Claims, 6 Drawing Sheets

LEAKAGE REDUCTION IN MEMORY DEVICES

TECHNICAL FIELD

This disclosure relates to integrated circuits (ICs). More specifically, it relates to memory devices and, even more specifically, to reducing power consumption of memory devices.

BACKGROUND

A memory device or memory can generally be described as hardware that can store data for later retrieval. Memory devices generally include a set of transistors used to store data (represented, for example, by an electrical charge) and a set of transistors used to control access to the data store. Individual transistors generally include a very thin insulating layer that separates a metal layer from a semiconductor layer. The insulator stops current flow when the transistor is switched "off".

Ideally in the "off" scenario no current passes through the transistor and no power is consumed. The thickness of the insulator is small enough, however, that some current passes or "leaks" through the transistor even when turned "off". The leakage current results in unnecessary power consumption. Although power consumption attributed to leakage current is small for an individual transistor, when multiplied over the millions of transistors that may be present in a memory device, the cumulative resultant power consumption attributed to leakage current is significant.

Memory storage densities continue to grow as consumers desire memory with larger capacity and smaller device sizes. Increasing memory storage density may be accomplished by reducing the size of the transistors in the memory device. Size reduction, or scaling, of the transistors is generally done in three dimensions, such that any reduction in the lateral dimensions is accompanied by a corresponding reduction in the vertical dimension. Generally, device operation in smaller transistors is similar to that of larger transistors only if scaling of both the lateral and vertical dimensions are substantially the same. The vertical size of such a transistor is, in part, determined by thickness of the insulating layer described earlier. Therefore, a reduction in the lateral size of the transistor demanded by a need for increasing storage densities leads to a reduction of insulating layer thickness.

Leakage current increases with decreasing thickness of the insulating layer. Therefore, a reduction in thickness of the transistor corresponds to larger leakage currents. For example, reduction of transistor sizes recently reached 65 nm and 45 nm, and will soon reach 32 nm. Leakage currents at the 65 nm node are generally less than 10 pA but at the 45 nm node leakage currents are greater than 20 pA. This increase in leakage current results in larger power consumption by the memory device.

One strategy to reduce power consumption is to prevent leakage current. Transistors used in memory cells require high performance and, as such, use low threshold voltage transistors. High threshold transistors, on the other hand, have significantly reduced leakage current when turned "off" but suffer from poor performance. Combining high threshold transistors with low threshold transistors can allow the high performance required of memory devices and low power consumption. Conventional memory designs place a high threshold transistor between the memory control circuitry and the negative supply voltage. This transistor is known as a periphery footswitch.

Use of high threshold transistors has, however, been limited to periphery control circuitry. As a result, only a fraction of the total leakage in the memory device is reduced. Transistors in other sections of the memory device continue to consume excess power through leakage current. Attempts at placing a footswitch in the core array have resulted in unacceptable ground bouncing or noise issues. Additionally, attempts at placing a high threshold transistor between the word line driver and the supply voltage has created abnormal behavior resulting from floating of the word line.

Another conventional method to reduce power consumption in the core array is the source biasing scheme. This scheme reduces leakage current but suffers from additional complexities. For example, layout complexity is significantly greater, which increases cost of design and manufacturing. Additionally, data retention is uncertain under source biasing schemes, and the power-on sequence for memory when coming out of sleep mode is very complex. Therefore, these schemes are difficult to implement in practical circuit design.

Thus, there is a need for a memory design with reduced power consumption.

BRIEF SUMMARY

According to one aspect of the disclosure, a memory device includes a core array including a plurality of memory cells and a headswitch coupled to the core array and a positive supply voltage. The headswitch reduces leakage current from the core array.

A method of reducing leakage current in a memory device having a core array and a data line includes supplying power to the core array. The method also includes floating the data line wherein leakage current is reduced and data is retained.

According to a further aspect of the disclosure, a memory device includes means for storing data, means for controlling access to stored data, means for switching off means for storing data, and means for switching off means for controlling access to stored data.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures for carrying out the same purposes of the present disclosure. It should also be realized by those skilled in the art that such equivalent constructions do not depart from the spirit and scope of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the disclosure in the present application, reference is now made to the following descriptions taken in conjunction with the accompanying drawings.

DETAILED DESCRIPTION

The present disclosure will be explained and better understood by reference to exemplary systems in which the disclosed circuitry may be employed, conventional devices used in such a system, and a detailed discussion of devices that may be used in such a system to provide reduced power consumption.

Figure 1:
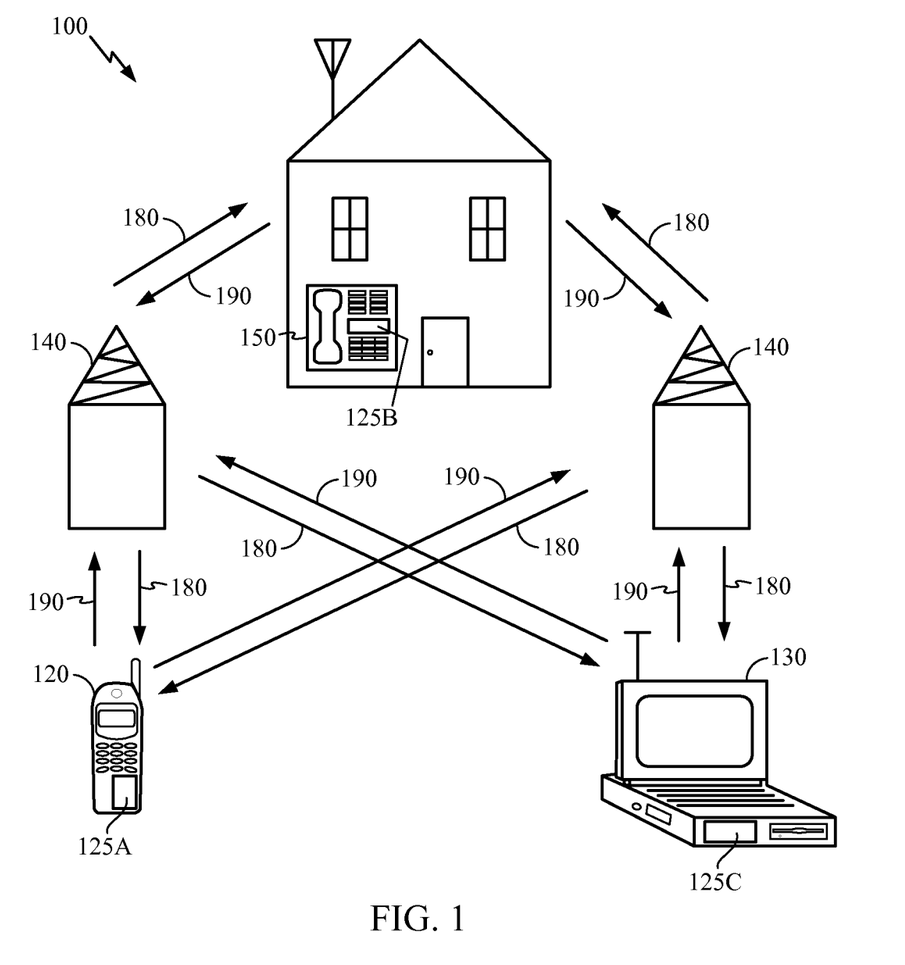
FIG. 1 is a block diagram illustrating an exemplary wireless communication system in which an embodiment of the disclosure may be advantageously employed.

FIG. 1 shows an exemplary wireless communication system 100 in which an embodiment of the disclosure may be advantageously employed. For purposes of illustration, FIG. 1 shows three remote units 120, 130, and 150 and two base stations 140. It will be recognized that typical wireless communication systems may have many more remote units and base stations. The remote units 120, 130, and 150 include IC devices 125A, 125B and 125C, that include the disclosed memory device. It will be recognized that any device containing an IC may also include the disclosed memory device, including the base units. FIG. 1 shows forward link signals 180 from the base stations 140 and the remote units 120, 130, and 150 and reverse link signals 190 from the remote units 120, 130, and 150 to base stations 140.

In FIG. 1, the remote units 120 is shown as a mobile telephone, the remote units 130 is shown as a portable computer, and the remote unit 150 is shown as a fixed location remote unit in a wireless local loop system. For example, the remote units may be mobile phones, hand-held personal communication systems (PCS) units, portable data units such as personal data assistants, navigation devices (e.g., GPS enabled devices,) set-top boxes, music players, video players, entertainment units, fixed location data units such as meter reading equipment, or any other device that stores or retrieves data or computer instructions, or any combination thereof. Although FIG. 1 illustrates remote units according to the teachings of the disclosure, the disclosure is not limited to these exemplary illustrated units. The disclosure may be suitably employed in any device which includes memory devices.

Figure 2:
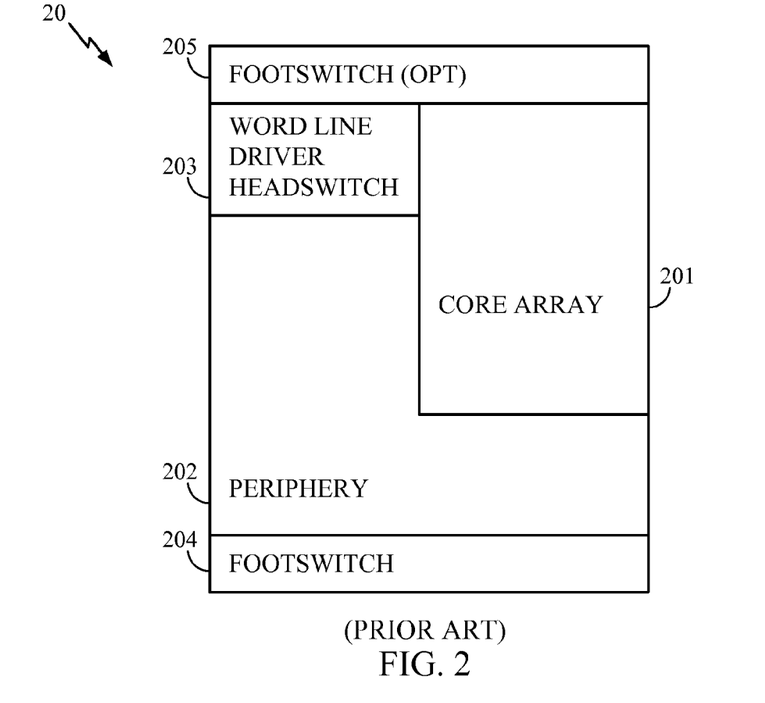
FIG. 2 is a block diagram illustrating a conventional memory device containing a footswitch for reducing power consumption by the periphery.

FIG. 2 is a block diagram illustrating a conventional memory device. A memory device 20 includes a core array 201 for data retention and a periphery 202 for controlling memory processes. The periphery 202 is coupled to a footswitch 204, which is useful for reducing leakage current in the periphery 202. When the memory design 20 receives a request for sleep mode, the footswitch 204 turns off to reduce leakage in the periphery 202. The memory design 20 further includes a word line driver headswitch 203 coupled to the periphery 202, which is also useful to reduce leakage current in the periphery 202. An optional footswitch 205 is coupled to the periphery 202 for further reducing leakage current depending on desired circuit characteristics.

Figure 3:
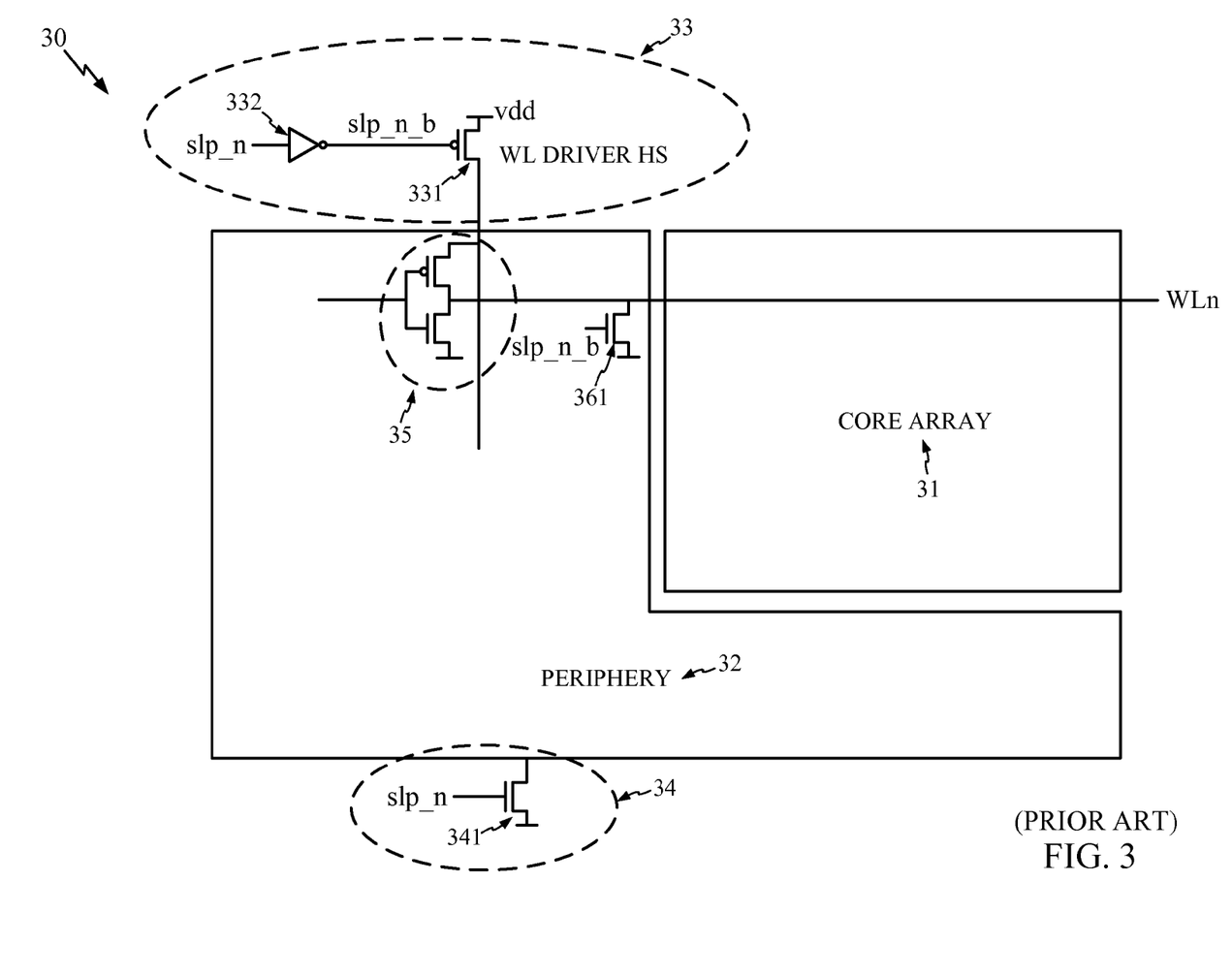
FIG. 3 is a schematic of a conventional circuit design for the periphery containing a footswitch and a word line driver headswitch.

For illustrative purposes, a circuit illustrating the conventional memory design will now be discussed. FIG. 3 is a schematic illustrating a conventional memory circuit with footswitches for leakage reduction. The memory circuit 30 includes a core array 31, a periphery 32, an array of word line driver headswitches (one shown) 33, an array of periphery footswitches (one shown) 34, and an array of word line drivers (one shown) 35. Inputs to the memory circuit 30 include a sleep signal, SLP_N, a positive supply voltage, $V_{DD}$, and a negative supply voltage, $V_{SS}$. The core array 31 includes a number of word lines (one shown), WLN. The word line driver headswitch 33 includes a transistor 331, and an inverter 332. The inverter 332 is coupled to the sleep signal SLP_N. An inverted sleep signal, SLP_N_B, is produced by the inverter 332 and coupled to the transistor 331. The periphery footswitch 34 includes a transistor 341 coupled to the sleep signal SLP_N. Additionally, a transistor 361 is coupled to the word line, WLN, to ground the word line during sleep mode.

In operational mode, the sleep signal, SLP_N, is high resulting in the transistor 331 being closed and the transistor 341 being closed. This allows the periphery 32 to couple to the positive and negative supply voltages. The word line driver 35 and the periphery 32 are active when the sleep signal, SLP_N, is high.

In sleep mode, the sleep signal, SLP_N, is low resulting in the transistor 331 being open and the transistor 341 being open. This disconnects the periphery 32 from the positive and negative supply voltages. The word line driver 35 and the periphery 32 are inactive when the sleep signal, SLP_N, is low. Additionally, the transistor 361 closes to ground the word line, WLN, preventing abnormal behavior resulting from floating the word line, WLN.

Figure 4:
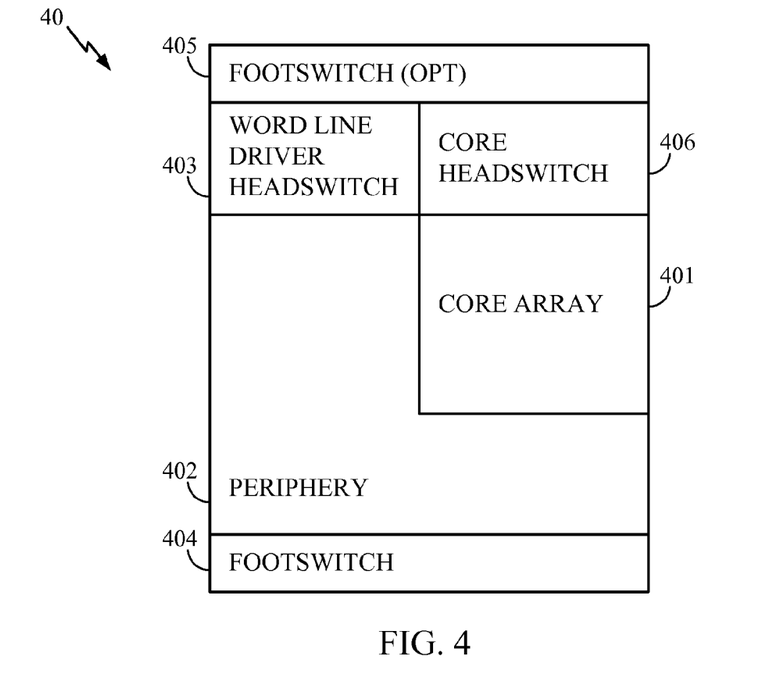
FIG. 4 is a block diagram illustrating an exemplary memory device containing a headswitch for reducing power consumption in the core array according to one embodiment of the disclosure.

FIG. 4 is a block diagram illustrating an exemplary memory device containing a headswitch for reducing power consumption in the core array according to one embodiment of the disclosure. A memory design 40 includes a core array 401, a periphery 402, a word line driver headswitch 403, a footswitch 404, and an optional footswitch 405. The memory design 40 also includes a core headswitch 406. The core headswitch 406 is coupled to the core array 401 and is useful for reducing leakage current in the core array 401. The core headswitch 406 may be left on or turned off when the memory design 40 receives a request to enter sleep mode. If the core headswitch 406 is turned off, leakage current is reduced; however, data stored in the core array 401 is lost. If the core headswitch 406 remains on during sleep mode, leakage current occurs and data stored in the core array 401 is retained. Addition of the core headswitch 406 generally reduces leakage current.

Figure 5:
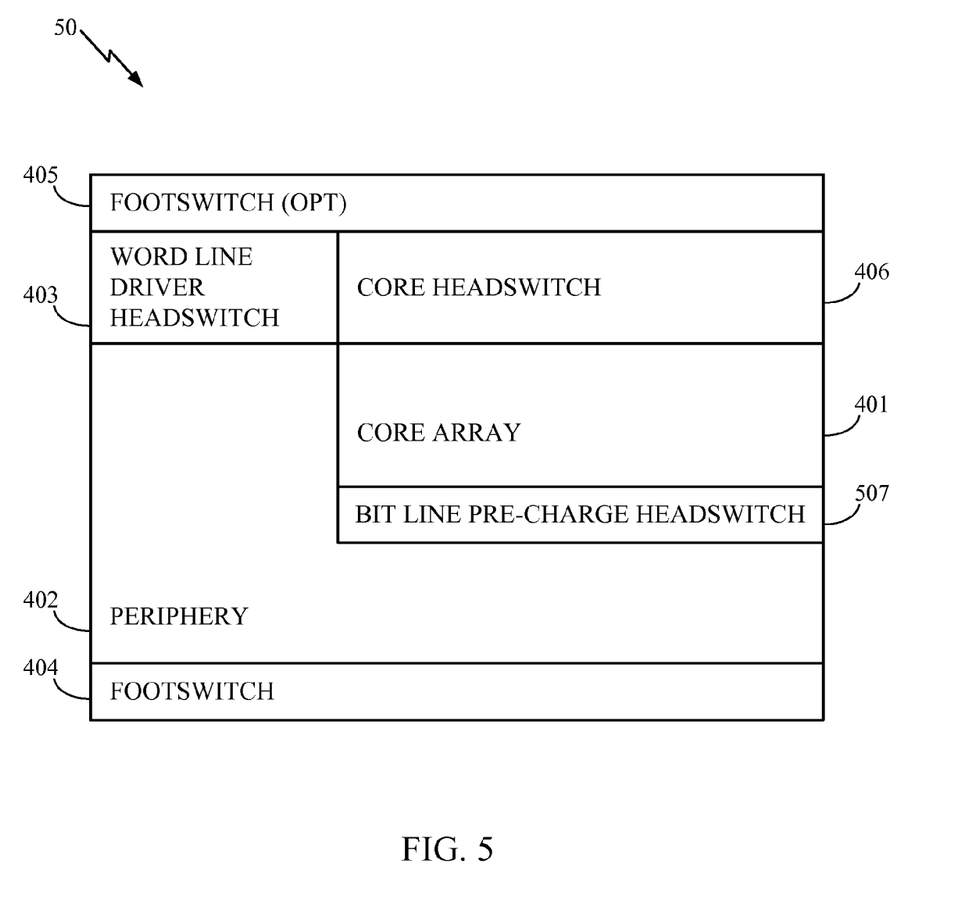
FIG. 5 is a block diagram illustrating an exemplary memory device containing a core headswitch and a headswitch for the bit line precharge circuitry according to one embodiment of the disclosure.

FIG. 5 is a block diagram illustrating an exemplary memory device containing a core headswitch and a headswitch for the bit line precharge circuitry according to one embodiment of the disclosure. A memory design 50 includes the core array 401, the periphery 402, the word line driver headswitch 403, the footswitch 404, the optional footswitch 405, and the core headswitch 406. The memory design 50 further includes a bit line precharge headswitch 507. The bit line precharge headswitch 507 is coupled to the periphery 402. When the memory design 50 receives a request to enter sleep mode, the bit line precharge headswitch 507 turns off coupled circuitry. The bit line precharge headswitch 507 results in a further reduction of leakage current.

Figure 6:
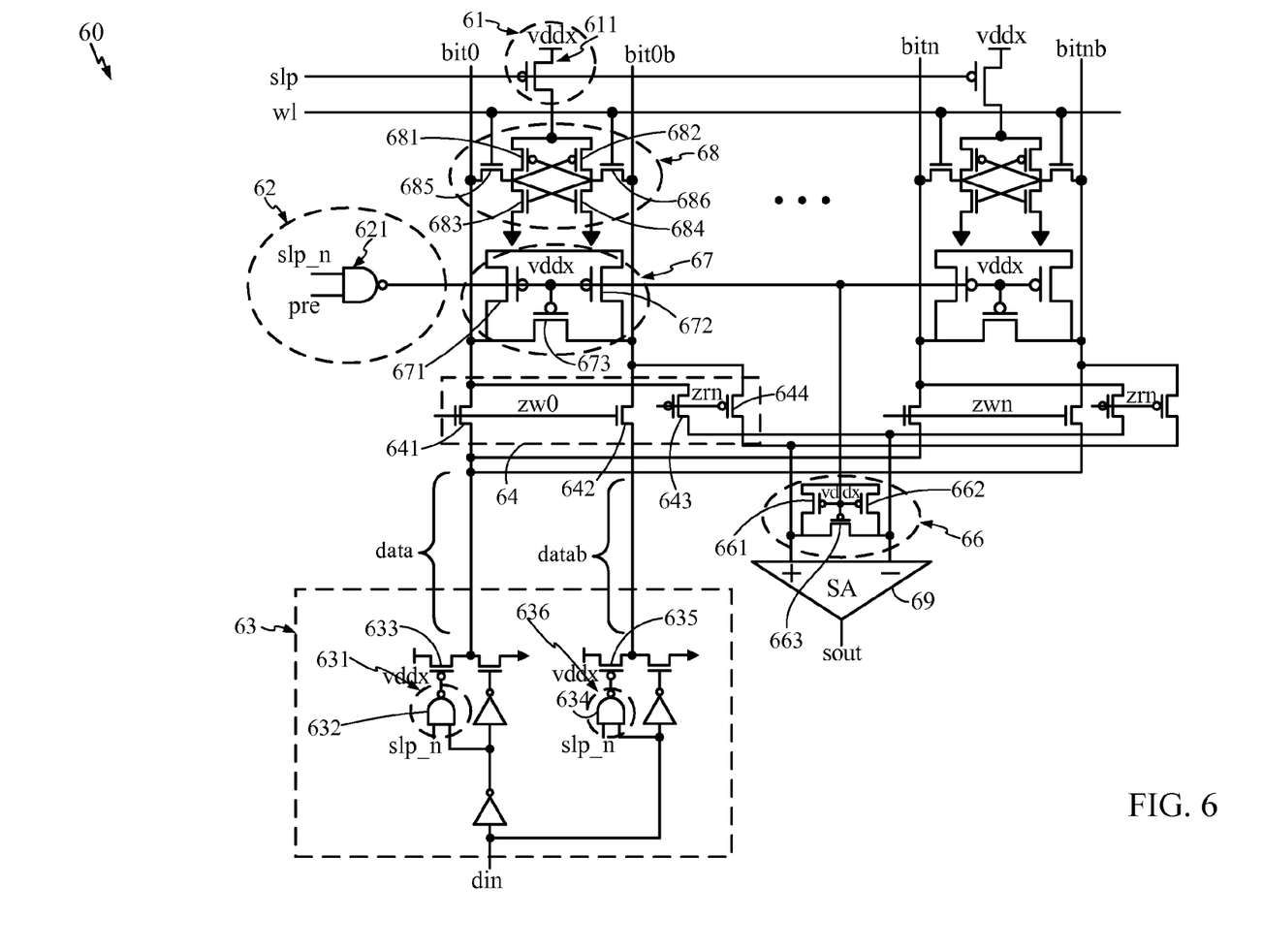
FIG. 6 is a schematic of an exemplary circuit design for leakage current reduction according to one embodiment of the disclosure.

An exemplary memory design will now be illustrated. Although the design of FIG. 5 is shown in the illustrated embodiment, the design of FIG. 4 may be implemented in similar manner. FIG. 6 is a schematic of an exemplary memory circuit for leakage current reduction according to one embodiment of the disclosure. Inputs to a memory circuit 60 include a sleep signal, SLP, an inverted sleep signal, SLP_N, a positive supply voltage, $V_{DDX}$, a negative supply voltage, $V_{SSP}$, a precharge signal, PRE. and a data input, DIN. The memory circuit 60 includes word lines (one shown as WL), bit lines BIT0-BITn, inverse bit lines BIT0B-BITn, a data line (one shown as DATA), and an inverse data line, (one shown as DATAB). The memory circuit 60 also includes a core headswitch 61, a bit line precharge headswitch control 62, a write driver 63, a column multiplexer 64, equalization circuitry 66, precharge circuitry 67, a memory cell 68, and a sense amplifier 69. In one embodiment, the bit line precharge circuit includes two components: a bit line precharge headswitch control 62 and a write driver head switch control 631. The circuit illustrated in FIG. 6 is one embodiment of the disclosure and corresponds to the block diagram of FIG. 5. Other embodiments not disclosed here may also include the embodiment of FIG. 4. Furthermore, only one word line, one pair of write drivers, one data line, one inverse data line, one bit line precharge headswitch control, one precharge circuit, one equalization circuit, and one sense amplifier are shown in FIG. 6, however, the memory device may include any number of each component.

The memory cell 68 includes at least six transistors. A transistor 681, a transistor 682, a transistor 683, and a transistor 684 are used to store charge representing the value "0" or "1". A transistor 685 and a transistor 686 are pass gates to pass values to and from the bit line BIT0, and the inverse bit line, BIT0B, respectively. The column multiplexer 64 includes a read column multiplexer 643, and a read column multiplexer 644 coupled to the bit line, BIT0, and the inverse bit line, BIT0B, respectively. The column multiplexer also includes a write column multiplexer 641, and a write column multiplexer 642 coupled to the data line, DATA, and the inverse data line, DATAB, respectively.

A general write operation will now be described to demonstrate operation of the memory circuit 60. During operation, the sleep signal SLP is low and the inverse sleep signal, SLP_N, is high. A write operation of the memory circuit 60 begins by precharging the bit line, BIT0, and the inverse bit line, BIT0B. During precharge, the precharge signal, PRE, is high which creates a low output signal from the bit line precharge headswitch control 62 to close a transistor 671, a transistor 672, and a transistor 673. These transistors precharge the bit line, BIT0, and inverse bit line, BIT0B, by coupling the bit line, BIT0, and the inverse bit line, BIT0B, to the supply voltage, $V_{DDX}$. After precharging is complete, the precharge signal, PRE, goes low and the bit line, BIT0, and the inverse bit line, BIT0B, are disconnected from the supply voltage, $V_{DDX}$. Next, data is provided to the data input, DIN. The write driver 63 discharges either the data line, DATA, or the inverse data line, DATAB to write the appropriate value based upon the data input, DIN. The write column multiplexers 641, 642 of the column multiplexer 64 couple the data line, DATA, to the bit line, BIT0, and the inverse data line, DATAB, to the inverse bit line, BIT0B, so the value can be written into the memory cell 68 via the pass gates 685, 686.

During a read operation, the read column multiplexers 643, 644 turn on so the sense amplifier 69 can sense the data on the bit lines BIT0, BIT0B.

The core array, including the memory cell 68 may leak current as described earlier, so the core headswitch 61 is provided to reduce leakage current. The core headswitch 61 includes a transistor 611 coupled to the sleep signal, SLP, and the positive supply voltage, $V_{DDX}$. In sleep mode, the sleep signal, SLP, is high causing the transistor 611 to disconnect the memory cell 68 from the supply voltage $V_{DDX}$. When the supply voltage, $V_{DDX}$, is disconnected, the memory cell 68 has smaller leakage current and power consumption is reduced.

During a precharge operation, current may leak from the precharge circuitry 67 and/or the equalization circuitry 66 via the pass gates 685, 686 and transistors 683, 684, as described earlier, so the bit line precharge headswitch control 62 is provided to reduce leakage current. The bit line precharge headswitch control 62 gates both the precharge circuitry 67 and the equalization circuitry 66 in sleep mode.

The bit line precharge headswitch control 62 includes a NAND gate 621. The NAND gate 621 couples to the inverted sleep signal SLP_N, and the precharge signal, PRE. When in sleep mode, the inverted sleep signal, SLP_N, is low, and the output from the NAND gate 621 is high which causes the transistor 671, the transistor 672, and the transistor 673 of the precharge circuitry to disconnect the bit line, BIT0, and inverse bit line, BIT0B, from the supply voltage $V_{DDX}$.

In one embodiment, the sleep mode also enables the foot switches. Therefore, the gate inputs to the read column multiplexers 643, 644 float, and the read column multiplexers 643, 644 are assumed to be on. Thus, the bit line precharge headswitch control 62 further couples to the equalization circuitry 66 to disconnect the transistor 661, the transistor 662, and the transistor 663 from the positive supply voltage, $V_{DDX}$. Consequently, the memory cell 68 will not leak current from the equalization circuitry 66 and, therefore, power consumption by the memory circuit 60 is reduced.

The write column multiplexers 641, 642 may facilitate current leakage from the write driver 63 via the pass gates 685, 686 and transistors 683, 684, as described earlier, so the write driver 63 includes a write driver headswitch control 631 to reduce leakage current. The write driver headswitch control 631 includes a NAND gate 632 coupled to the inverse sleep signal, SLP_N, and the data input, DIN. The write driver 63 also includes a transistor 633 coupled to the data line, DATA, and the positive supply voltage, $V_{DDX}$. When in sleep mode, the inverted sleep signal, SLP_N, is low, and the output from the NAND gate 632 is high causing the transistor 633 to disconnect the data line, DATA, from the supply voltage, $V_{DDX}$. A NAND gate 634 and a transistor 635 are provided in a similar fashion to disconnect the inverse data line, DATAB, from the supply voltage, $V_{DDX}$. Accordingly, even if the write column multiplexers 641, 642 are on during sleep mode, current leaking from the write driver 63 is reduced.

In one embodiment, when sleep mode is active, the bit line, BIT0, and inverse bit line, BIT0B, are disconnected from all supply voltages and ground (even if the column multiplexer 64 is on) through the combination of the headswitch controls and the footswitches. Therefore, the bit lines are, floating lines. When all supply voltages are disconnected, there is no path for current to flow. This significantly reduces leakage current and power consumption by the memory device.

The bit line precharge headswitch control 62 and write driver headswitch control 631 are easily integrated into existing memory device logic. Area required for the bit line precharge headswitch control 62 is very small and can be easily merged into core array boundary cells. As a result, there is no performance penalty for these headswitches and they occupy no additional area on the manufacturing substrate.

For illustrative purposes the operational and sleep mode of the exemplary memory circuit of FIG. 6 will now be described. The memory circuit 60 begins in an active state where the sleep signal, SLP, is low and the inverted sleep signal, SLP_N, is high. As a result, the core headswitch 61 is turned on and the memory cell 68 is connected to the supply voltage, $V_{DDX}$.

During the precharge phase, the output of the NAND gate 621 is low. As a result, the precharge circuitry 67 is connected to the supply voltage, $V_{DDX}$, and the equalization circuitry 66 is connected to the supply voltage, $V_{DDX}$. The bit line, BIT0, and inverse bit line, BIT0B, may be precharged to high. The data line, DATA, and inverse data line, DATAB, may also be precharged to high when that particular column is selected for a write operation.

A sleep mode request is received by the memory circuit 60 when the sleep signal, SLP, is high and the inverted sleep signal, SLP_N, is low. The transistor 611 in the core headswitch 61 disconnects the memory cell 68 from the supply voltage, $V_{DDX}$. In one embodiment, the core headswitch 61 is not switched off if data retention is desired, in which case it may remain on. The footswitches and other headswitches may be switched off while still retaining data. The footswitches and headswitches may be controlled by separate sleep signals. The output of the NAND gate 621 in the bit line precharge headswitch control 62 is high when the inverted sleep signal, SLP_N, is low regardless of the state of the precharge signal, PRE. As a result, the precharge circuit 67 and equalization circuitry 66 switch off and disconnect the bit line, BIT0, and inverse bit line, BIT0B, from the supply voltage, $V_{DDX}$.

As a result of the inverted sleep signal, SLP_N activating the write driver headswitch control 631 the output of the NAND gate 632 in the write driver headswitch control 631 becomes high that in combination with the footswitch, results in disconnection of the data line, DATA, from any voltage source and the data line, DATA, becomes a floating line. Additionally, an inverse data line precharge headswitch 636 including a NAND gate 634 controls a transistor 635 coupled to the inverse data line, DATAB. The output of the NAND gate 634 in the inverse data line precharge headswitch control 636 changes similarly and disconnects the inverse data line, DATAB, from all supply voltages, and the inverse data line, DATAB, becomes a floating line.

In accordance with the disclosure, leakage reduction is significantly decreased and, as a result, power consumption of the memory circuit is similarly decreased when in sleep mode. In sleep mode, all supply voltages are gated. Leakage current is reduced exponentially with the supply voltage level, therefore, leakage current is significantly reduced. Furthermore, all signal lines are left floating in sleep mode through a combination of headswitch controls and footswitches. As result, there is no leakage current from transistors attached to the signal lines.

Figure 7:
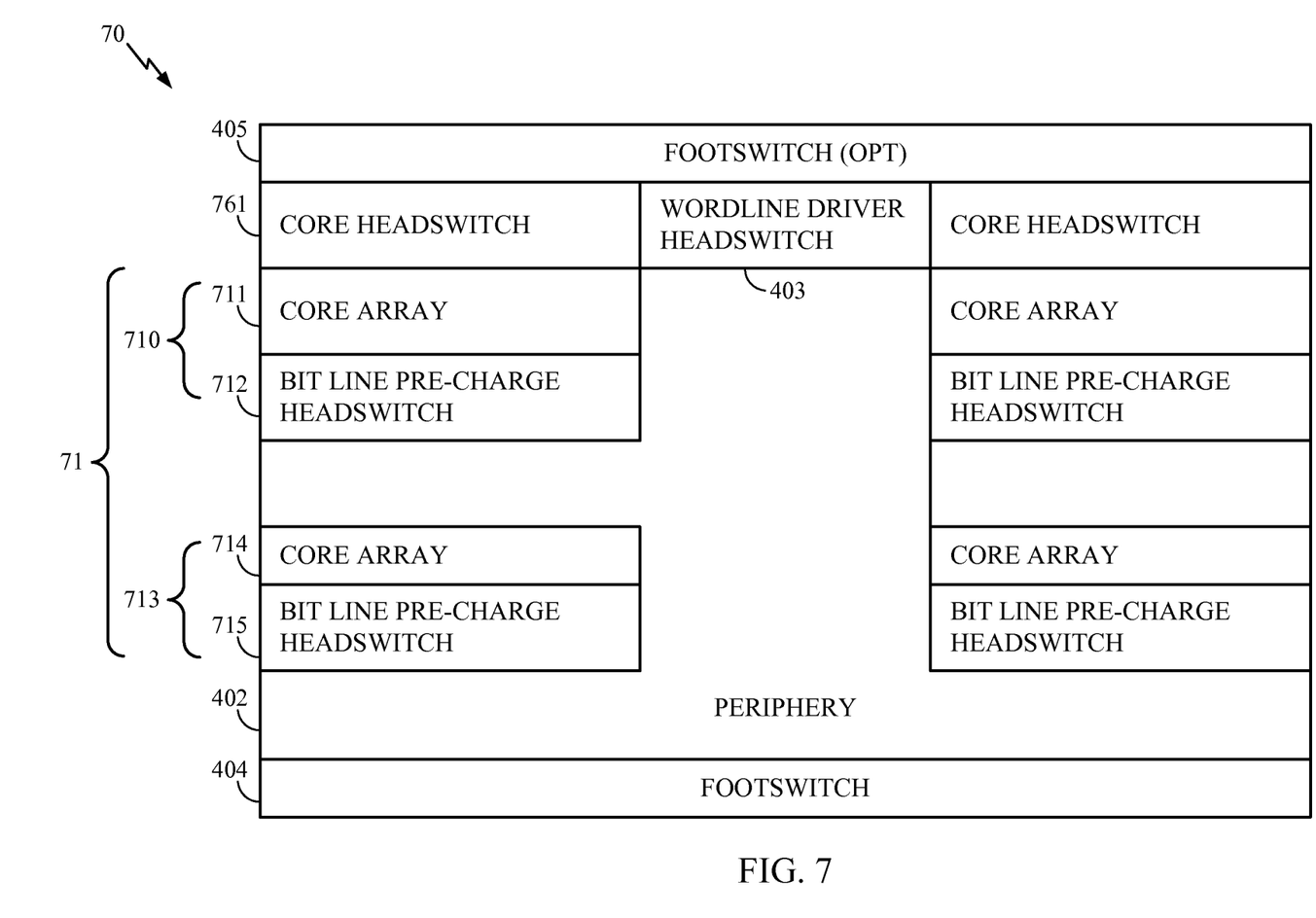
FIG. 7 is a block diagram illustrating an exemplary memory device with combined footswitch and headswitch scheme for memory containing multiple core arrays according to one embodiment of the disclosure.

FIG. 7 is a block diagram illustrating an exemplary memory device including multiple core arrays according to one embodiment of the disclosure. A memory device 70 includes a memory bank 710 that includes a core array 711 and a bit line precharge headswitch 712 coupled to the core array 711. The memory bank 710 is coupled to the core headswitch 761. A second memory bank 713 includes a core array 714 and a bit line precharge headswitch 715. The memory bank 713 is also coupled to the core headswitch 761. The memory bank 710, the memory bank 713, and additional memory banks (not illustrated) make up a memory column 71. All memory banks in the memory column 71 couple to the core headswitch 761. The memory device 70 may include additional memory columns not illustrated here. Each additional memory column may be coupled to a separate core headswitch. A person skilled in the art will recognize that any number of memory banks and memory columns can be implemented in a similar arrangement. The memory device 70 also includes a periphery 402, a word line driver headswitch 403, a footswitch 404, and an optional footswitch 405. Although the memory device including multiple core arrays of FIG. 7 includes an embodiment as disclosed in FIG. 5, it could also include the embodiment of FIG. 4.

In a multi-bank architecture, one small size core headswitch is sufficient for each memory cell column. Thus, a row of core head switches is sufficient for all memory banks However, to reduce the complexity of device layout and manufacturing, one row of core headswitches may be placed in each memory bank. The layout area used by this headswitch is very small when integrated into a core top wrapper cell. Core top wrapper cells are core top boundary cells that do not belong to the core array.

Thus, it can be seen that through a combination of a core headswitch, a bit line precharge control, and a data line precharge control all supply voltages are disconnected from a memory circuit when sleep mode is active. The core headswitch acts to reduce leakage current from the memory core. The bit line precharge control and data line precharge control act to disconnect signal lines from supply voltages to further reduce leakage current. This head switch combination, in addition to the use of foot switching results in a substantial reduction in leakage current, and therefore power consumption.

Coupling as set forth in this document refers to any method available to transmit signals from one location to a second location either directly or indirectly. The signals are unaltered and unprocessed between coupling points. This can include electrical, optical, or other methods.

Although specific circuitry has been set forth, it will be appreciated by those skilled in the art that not all of the disclosed circuitry is required to practice the disclosure. Moreover, certain well known circuits have not been described, to maintain focus on the disclosure. Similarly, although the description refers to logical "0" or "low" and logical "1" or "high" in certain locations, one skilled in the art appreciates that the logical values can be switched, with the remainder of the circuit adjusted accordingly, without affecting operation of the present disclosure.

Although the present disclosure and its advantages have been described in detail, it should be understood that various changes, substitutions and alterations can be made herein without departing from the teachings of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A memory device comprising:
a core array comprising a plurality of memory cells and a core array headswitch, the core array headswitch coupled to a positive supply voltage, the core array headswitch reducing leakage current from the core array;
a write driver coupled to the core array, the write driver comprising:
a plurality of write driver headswitch transistors coupled to data lines; and
control logic coupled to the write driver headswitch transistors and configured to disconnect the data lines from a supply voltage to reduce leakage current from the data lines in response to the data lines and a control signal;
a bit line precharge circuit coupled to bit lines; and
a logic gate coupled to the bit line precharge circuit and an equalization circuit, wherein the logic gate is selected from the group consisting of a NAND gate, a NOR gate, a XOR gate and a NXOR gate, wherein a first input of the logic gate is coupled to the control signal, a second input of the logic gate is coupled to a precharge signal, and wherein the logic gate is configured to:
generate an output based on the first input of the logic gate and the second input of the logic gate; and
if the output is high, the bit line precharge circuit disconnects the bit lines from the supply voltage.

2. The memory device of claim 1, in which the memory cells comprise at least six transistors having a first threshold voltage.

3. The memory device of claim 2, in which the core array headswitch comprises at least one transistor having a second threshold voltage greater than the first threshold voltage.

4. The memory device of claim 1, in which the core array headswitch coupled to the core array is controlled by a first sleep signal and the control signal inputted into the logic gate is a second sleep signal.

5. The memory device of claim 1, in which the core array headswitch is coupled to a plurality of core arrays.

6. The memory device of claim 5, the logic gate further coupled to each of the plurality of core arrays.

7. The memory device of claim 1, further comprising:
a periphery control circuit coupled to the core array; and
a footswitch coupled to the periphery control circuit.

8. The memory device of claim 1, in which the core array is comprised of a plurality of columns of core arrays.

9. The memory device of claim 8, in which the core array headswitch couples to a column of core arrays.

10. The memory device of claim 8, the logic gate further coupled to each of the core arrays.

11. The memory device of claim 1, in which the memory device is integrated into a semiconductor die.

12. The memory device of claim 1, in which the memory device is incorporated in a device selected from a group consisting of a mobile phone, personal data assistant (PDA), navigation device, fixed location data unit, set-top box, music player, video player, entertainment unit, and computer.

13. The memory device of claim 1, wherein the control signal comprises an inverted sleep signal.

14. A method of reducing leakage current in a memory device having a core array and a plurality of data lines, comprising:
supplying power to the core array, the core array comprising a plurality of memory cells;
coupling a core headswitch to the power supply;
coupling a write driver headswitch transistor to each of the plurality of data lines;
coupling control logic to the write driver headswitch transistor;
disconnecting the supply voltage from the data lines by the control logic coupled to the write driver headswitch transistors to reduce leakage current in response to the data lines and a control signal;
coupling a bit line precharge circuit to bit lines;
coupling a logic gate to the bit line precharge circuit and an equalization circuit, wherein the logic gate is selected from the group consisting of a NAND gate, a NOR gate, a XOR gate and a NXOR gate, wherein a first input of the logic gate is coupled to the control, an XOR gate, a NXOR gate, and an inverter, wherein a first input of the logic gate signal, and wherein a second input of the logic gate is coupled to a precharge signal, and wherein the method further comprises:
at the logic gate, generating an output based the first input of the logic gate and the second input of the logic gate; and
if the output is high, disconnecting the supply voltage from the bit lines and the equalization circuit.

15. The method of claim 14, wherein the memory device is applied in an electronic device, selected from a group consisting of a set top box, music player, video player, entertainment unit, navigation device, communications device, personal digital assistant (PDA), fixed location data unit, and a computer, into which a semiconductor device is integrated.

16. A core array of a memory device for reducing leakage, the core array comprising:
means for storing data;
means for decoupling power from the data storing means, the power decoupling means coupled to a positive supply voltage, the power decoupling means reducing current from the core array;
means for accessing stored data;
a plurality of signal gated write driver headswitch transistors coupled to the accessing means;
means for disconnecting the accessing means from a supply voltage to reduce leakage current from the accessing means in response to the accessing means and a control signal;
a bit line precharge circuit coupled to bit lines;
a logic gate coupled to the bit line precharge circuit and an equalization circuit, wherein the logic gate is selected from the group consisting of a NAND gate, a NOR gate, a XOR gate and a NXOR gate, wherein a first input of the logic gate is coupled to the control signal, a second input of the logic gate is coupled to a precharge signal, and wherein the logic gate is configured to:
generate an output based on the first input of the logic gate and the second input of the logic gate; and
if the output is high, disconnect the supply voltage from the bit lines and the equalization circuit.

17. The memory device of claim 16, in which the memory device is integrated into a semiconductor die.

18. The memory device of claim 16, in which the memory device is incorporated in a device selected from a group consisting of a mobile phone, personal data assistant (PDA), navigation device, fixed location data unit, set-top box, music player, video player, entertainment unit, and computer.

19. A method of reducing leakage current in a memory device having a core array and a plurality of data lines, comprising the steps of:
supplying power to the core array, the core array comprising a plurality of memory cells;
coupling a core headswitch to the power supply;

coupling a write driver headswitch transistor to each of the plurality of data lines;

coupling control logic to the write driver headswitch transistor;

disconnecting the supply voltage from the data lines by the control logic coupled to the write driver headswitch transistors to reduce leakage current in response to the data lines and a control signal;

coupling a bit line precharge circuit to bit lines;

coupling a logic gate to the bit line precharge circuit and an equalization circuit, wherein the logic gate is selected from the group consisting of a NAND gate, a NOR gate, a XOR gate and a NXOR gate, wherein a first input of the logic gate is coupled to the control signal, and a second input of the logic gate is coupled to a precharge signal;

at the logic gate, generating an output based on the first input of the logic gate and the second input of the logic gate; and if the output is high, disconnecting the supply voltage from the bit lines and the equalization circuit.

20. The method of claim 19, wherein the memory device is applied in an electronic device, selected from a group consisting of a set top box, music player, video player, entertainment unit, navigation device, communications device, personal digital assistant (PDA), fixed location data unit, and a computer, into which a semiconductor device is integrated.

* * * * *